United States Patent
Li et al.

(10) Patent No.: US 11,126,887 B2
(45) Date of Patent: Sep. 21, 2021

(54) ENHANCED GRAPH TRANSFORMATION-BASED POINT CLOUD ATTRIBUTE COMPRESSION METHOD

(71) Applicant: PEKING UNIVERSITY SHENZHEN GRADUATE SCHOOL, Guangdong (CN)

(72) Inventors: Ge Li, Guangdong (CN); Yiting Shao, Guangdong (CN)

(73) Assignee: Peking University Shenzhen Graduate School, Guangdong (CN)

( * ) Notice: Subject to any disclaimer, the term of this patent is extended or adjusted under 35 U.S.C. 154(b) by 0 days.

(21) Appl. No.: 16/957,187

(22) PCT Filed: Feb. 12, 2018

(86) PCT No.: PCT/CN2018/076495
§ 371 (c)(1),
(2) Date: Jun. 23, 2020

(87) PCT Pub. No.: WO2019/153342
PCT Pub. Date: Aug. 15, 2019

(65) Prior Publication Data
US 2020/0394450 A1 Dec. 17, 2020

(30) Foreign Application Priority Data
Feb. 11, 2018 (CN) .......................... 201810142763.8

(51) Int. Cl.
*G06K 9/62* (2006.01)
*G06T 7/30* (2017.01)
(Continued)

(52) U.S. Cl.
CPC ........... *G06K 9/6224* (2013.01); *G06F 17/16* (2013.01); *G06K 9/6232* (2013.01); *G06T 7/30* (2017.01);
(Continued)

(58) Field of Classification Search
CPC ...... G06K 9/6224; G06K 9/6232; G06T 7/30; G06T 7/90; G06T 7/60;
(Continued)

(56) References Cited

U.S. PATENT DOCUMENTS

| 6,529,634 B1 | 3/2003 | Thyagarajan et al. |
| 10,552,989 B2 | 2/2020 | Li et al. |

(Continued)

FOREIGN PATENT DOCUMENTS

| CN | 101005623 | 7/2007 |
| CN | 101383972 | 3/2009 |

(Continued)

OTHER PUBLICATIONS

English translation of International Search Report from corresponding PCT Appln No. PCT/CN2018/076495, dated Oct. 15, 2018.

*Primary Examiner* — Nasim N Nirjhar
(74) *Attorney, Agent, or Firm* — Grossman, Tucker, Perrault & Pfleger, PPLC

(57) ABSTRACT

An enhanced graph transformation-based point cloud attribute compression method. For point cloud attribute information, a point cloud is first subjected to airspace division by using a K-dimension (KD) tree; a new graph transformation processing method in combination with spectral analysis is provided; the point cloud is then subjected to spectral clustering on graphs in coded blocks of the point cloud; expansion is performed on the basis of existing graph transformation to implement a local graph transformation scheme; enhanced graph transformation with two transformation modes is formed; the compression performance of graph transformation is improved. The method comprises: performing color space transformation of point cloud attributes; dividing the point cloud by using the KD tree to obtain the coded blocks; performing spectral clustering-based enhanced graph transformation; performing transfor- (Continued)

mation mode decision; and performing uniform quantization and entropy coding. Provided is a new spectral analysis-based enhanced graph transformation scheme, wherein two transformation modes are comprised, and the optimal mode is selected by the mode decision; after the point cloud is divided with the tree, a graph is created in each coded block and the graph transformation is used as transformation mode I; on this basis, graph spectral clustering is implemented; the graph is divided into two local graphs and then local graph transformation is performed to serve as transformation mode II; in the enhanced graph transformation scheme supporting the two transformation modes, the optimal mode is selected by the mode decision to achieve the optimal performance of point cloud attribute compression.

6 Claims, 3 Drawing Sheets

(51) Int. Cl.
  *G06T 7/90*   (2017.01)
  *G06F 17/16*  (2006.01)
  *G06T 7/60*   (2017.01)

(52) U.S. Cl.
  CPC .............. *G06T 7/60* (2013.01); *G06T 7/90* (2017.01); *G06T 2207/10028* (2013.01)

(58) Field of Classification Search
  CPC .......... G06T 2207/10028; G06T 9/007; G06F 17/16; H03M 7/405; H03M 7/70; H04N 19/186; H04N 19/96
  See application file for complete search history.

(56) References Cited

U.S. PATENT DOCUMENTS

| 2013/0034153 | A1* | 2/2013 | Song ................ H04N 19/159 375/240.03 |
| 2016/0198156 | A1* | 7/2016 | Jung ................ H04N 19/176 375/240.03 |
| 2017/0213381 | A1* | 7/2017 | Bronstein ............ G06K 9/6244 |
| 2019/0087978 | A1* | 3/2019 | Tourapis ................... G06T 9/00 |
| 2019/0156518 | A1* | 5/2019 | Mammou ............. G06T 7/0002 |
| 2020/0334866 | A1* | 10/2020 | Lasserre ................... G06T 9/40 |

FOREIGN PATENT DOCUMENTS

| CN | 105654530 | 6/2016 |
| CN | 107403456 | 11/2017 |

* cited by examiner

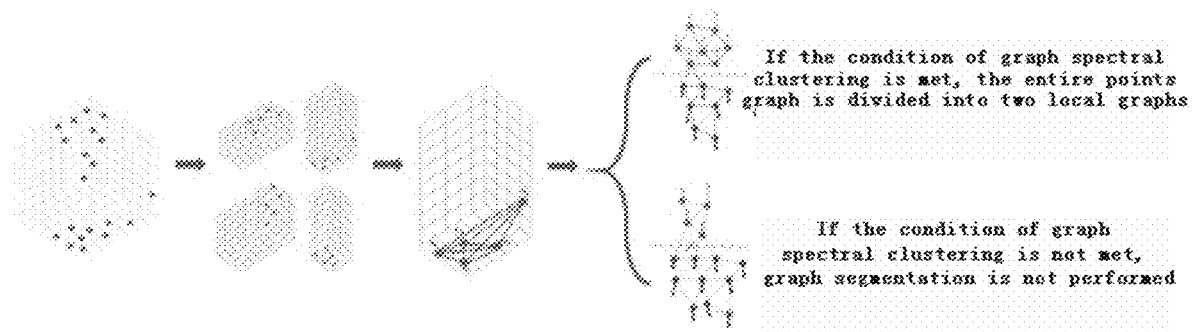
Fig. 2
| Header Information | Coding block 1 transformation mode | Coding block 1 residual code stream | Coding block 2 transformation mode | Coding block 2 residual code stream | ...... | Coding block i transformation mode | Coding block i residual code stream |
Fig. 3
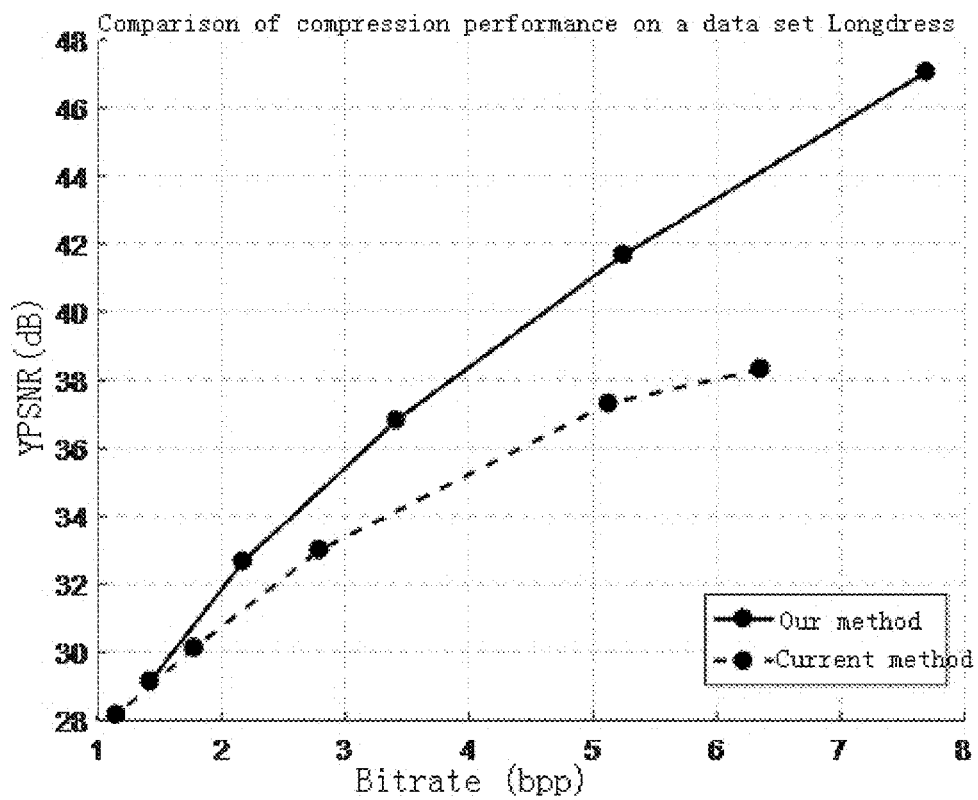
Fig. 4a

ENHANCED GRAPH TRANSFORMATION-BASED POINT CLOUD ATTRIBUTE COMPRESSION METHOD

TECHNICAL FIELD

The invention belongs to the technical field of point cloud data processing, and relates to a point cloud data compression method, in particular to an enhanced graph transformation-based point cloud attribute compression method.

BACKGROUND ART

Three-dimensional point cloud is an effective way to express the three-dimensional structure of real world. With the rapid development of three-dimensional scanning devices (laser, radar, etc.), the precision and resolution of point cloud are higher, which makes it possible to digitalize three-dimensional information in real world with high efficiency and precision. The high-precision point cloud is widely applied to intelligent cities, driverlessness, cultural relics protection and other hot fields. The point cloud is obtained by sampling the surface of an object by a three-dimensional scanning device, the points of a frame of point cloud is generally in the level of millions, each point contains geometric information, color, texture and other attribute information, with a very large data volume. The huge data volume of three-dimensional point cloud brings great challenges to data storage and transmission, so that the point cloud compression is very necessary.

The point cloud compression is mainly divided into geometric compression and attribute compression, and the existing point cloud attribute compression framework mainly comprises the following methods.
1. A method based on octree decomposition and DCT includes the steps of: firstly, performing spatial decomposition on the point cloud by using the octree to obtain coded blocks, then performing depth-first traversal on the tree, writing color values of traversed nodes into a two-dimensional JPEG table according to a serpentine sequence, and then encoding the obtained point cloud color table by using an existing JPEG encoder, wherein DCT is used by the JPEG encoder. According to the method, an existing encoder is utilized, with low calculation complexity; however, the spatial correlation between points is not fully utilized, and the compression performance needs to be improved.
2. A method based on octree decomposition and graph transformation includes the steps of: firstly, performing spatial decomposition on the point cloud by using the octree, and dividing the point cloud into specific layers to obtain transformation blocks; forming a graph in each transformation block, connecting two points, with the distance not exceeding 1, along any coordinate axis by one edge, wherein the weight of the edge is inversely proportional to the Euclidean distance; and then performing graph transformation on the attribute information of the nodes in the graph. The compression performance of the method is good; however, the method has high operation complexity, can bring subgraph problems by its graph composition mode, and influences the efficiency of graph transformation; and it still has an improved space.
3. A method based on KD tree decomposition and graph transformation includes the steps of: firstly, performing spatial decomposition on point cloud by using the KD tree, and dividing the point cloud to a certain depth to obtain transformation blocks, wherein the number of points contained in each transformation block is approximately the same; in the transformation block, every two points are connected by one edge, the weight of the edge is related to the Euclidean distance, and a Euclidean distance threshold for the set edge determines the sparsity of the graph; and then performing graph transformation on the attribute information of the points in the graph. The method completely solves the subgraph problem; meanwhile, the compression performance is greatly improved compared with the former two methods, but the operation complexity is high, and the performance still needs to be improved.

SUMMARY OF THE INVENTION

In order to overcome the defects of the prior art and further improve the compression performance of point cloud attributes, the invention provides a point cloud attribute compression method based on enhanced graph transformation, which comprises the steps of, firstly, subjecting a point cloud to airspace division by using a K-dimension (KD) tree; then, subjecting graphs in coded blocks to spectral clustering by using spectral analysis-based graph transformation processing; performing expansion on the basis of existing graph transformation to implement a local graph transformation scheme; and forming enhanced graph transformation with two transformation modes to improve the compression performance of graph transformation.

The technical scheme provided by the invention is as follows.

A point cloud attribute compression method based on enhanced graph transformation is provided, comprising, for point cloud data, first subjecting point cloud to airspace division by using a KD tree to obtain coded blocks; providing a new graph transformation processing method in combination with spectral analysis; then subjecting the point cloud to spectral clustering on graphs in coded blocks of the point cloud; performing expansion on the basis of existing graph transformation to implement a local graph transformation scheme so as to form enhanced graph transformation with two transformation modes; and selecting an optimal mode according to the mode decision so as to achieve the optimal performance of attribute compression; the method comprises the steps of:

1) color space transformation of point cloud attributes: reading in point cloud attribute information to be processed, and transforming a point cloud color space from an RGB space to a YUV space according to the visual characteristics of human eyes and the difficulty degree of compression processing;

2) dividing the point cloud by using a KD tree to obtain coded blocks: performing KD tree division on the point cloud according to the geometric information, selecting a coordinate axis with a largest distribution variance in the position coordinate of the point cloud as a division axis each time, selecting a point with the coordinate being a median value as a division point, and performing iterative division until reaching a set KD tree depth; a block obtained from a last layer divided by the KD tree being a coded block of the point cloud, numbering the coded blocks according to a breadth traversal sequence;

3) spectral clustering-based enhanced graph transformation: sequentially transforming the coded blocks according to the numbering sequence of the coded blocks, expanding spectral clustering of the graphs on the basis of the existing graph transformation to form enhanced graph transformation, and providing two transformation modes; in the coded block, every two points $n_i$ and $n_j$ are connected by an edge $\varepsilon_{ij}$ to construct an entire points graph G, wherein the weight of the edge is determined by the geometric positions of the two points; the weight $\omega_{ij}$ of the edge $\varepsilon_{ij}$ reflects geometric correlation between the two points $n_i$ and $n_j$, and the weight $\omega$ form an adjacent matrix W of the graph to further obtain a feature vector matrix A;

transformation mode I: taking the feature vector A as a transformation matrix of a graph, and transforming the color information of the coded block;

transformation mode II: the feature vector matrix A of the graph G reflects the spectrum distribution of the graph; clustering all points in the block into two types by using a plus-minus sign of the second dimension column vector of the matrix A; if the number of the two types of points reaches more than 40% of the total number of the points in the block, dividing the graph G into two local graphs $G_1$ and $G_2$ according to the clustering condition, so as to respectively obtain corresponding feature vector matrix $A_1$ and $A_2$; transforming the color information in the two local graphs $G_1$ and $G_2$ by using a corresponding transformation matrix;

4) transformation mode decision: providing two modes for transforming the color information of the coded block, and performing a mode decision by estimating the transformation performance to select an optimal transformation mode; calculating the proportion of the sum of absolute values of the previous k maximum coefficients in the transformed coefficients in the sum of the absolute values of the transformed coefficients as the score of the transformation mode; the higher the score is, the higher the proportion of the selected transformation coefficient in the total transformation coefficient is, representing higher transformation efficiency and better performance in the mode, wherein the mode with the highest score is selected as the transformation mode of the current block;

5) generation of a code stream with point cloud attribute compression: iteratively processing all the coded blocks according to the sequence, quantizing the transformed coefficients, and performing entropy coding by combining the transformation mode information to obtain a final code stream with point cloud attribute compression.

The color space transformation in the step 1) comprises the following specific processes:

(1-1) A point $p_i$ in the point cloud has color values $r_i$, $g_i$ and $b_i$ in an RGB color space, the RGB is transformed into a YUV color space by a color space transformation matrix, and the color values thereof are $y_i$, $u_i$ and $v_i$;

(1-2) The mathematical expression for the color space transformation is as follows.

$$[y_i, u_i, v_i] = [r_i, g_i, b_i] \times \begin{bmatrix} 0.2126 & 0.7152 & 0.0722 \\ -0.1146 & -0.3854 & 0.5 \\ 0.5 & -0.4542 & -0.0458 \end{bmatrix} \quad \text{(Formula 1)}$$

The specific process for dividing and numbering the coded blocks in the step 2) comprises the steps of: when the KD tree is divided, selecting a coordinate axis with the largest distribution variance of the points as a division axis, with a full consideration of the correlation of the points in the transformation block; meanwhile, selecting a point with the coordinate on the division axis being a median value as a division point, so that the number of points in the transformation block is basically the same. let the point cloud to be processed have N points, and the division depth set by the KD tree be d, $2^d$ coded blocks are obtained after the point cloud is divided for d times; and all coded blocks are numbered with $b_1, b_2, \ldots, b_i, \ldots, b_{2^d}$ in the breadth traversal sequence.

The specific process for the enhanced graph transformation described in the above step 3) comprises the steps of:

(3-1) constructing a graph G in each transformation block, wherein each two points $n_i$ and $n_j$ are connected by an edge $\varepsilon_{ij}$ and the weight $\omega_{ij}$ of the edge $\varepsilon_{ij}$ is related to the Euclidean distance between the two points and generally represented by the a formula 2:

$$\omega_{i,j} = \begin{cases} e^{-\frac{\|n_i - n_j\|_2^2}{\sigma^2}}, & \text{if } \|n_i - n_j\|_2^2 \le \tau; \\ 0, & \text{else,} \end{cases} \quad \text{(Formula 2)}$$

wherein the parameter $\sigma$ reflects the distribution variance of the current point cloud; the parameter ti is a distance threshold for judging whether a connection line is formed between the two points, which determines the sparsity of a graph Laplacian matrix, and an experience set value is generally used;

(3-2) the adjacent matrix W of the graph G is a set of edge weights $\omega_{ij}$ and reflects the correlation between each point in the transformation block; the density matrix D of the graph G is a diagonal matrix, wherein $D_i$ is the sum of non-zero elements in the row of the adjacent matrix and represented by a formula 3, reflecting the density of correlation between the th $i^{th}$ point and other points; the transformation operator of graph G adopts a Laplacian matrix L, and is represented by a formula 4:

$$D_i = \Sigma_j \omega_{i,j} \quad \text{(Formula 3)}$$

$$L = D - W \quad \text{(Formula 4)}$$

(3-3) performing characteristic decomposition on the Laplacian matrix L to obtain a feature vector matrix A, which serves as a global graph transformation matrix in the transformation mode 1 for compressing the point cloud attribute information, which is represented by a formula 5:

$$L = A \Lambda A^{-1} \quad \text{(Formula 5)}$$

(3-4) performing spectral clustering on the second dimension column vector $V_2$ of the feature vector matrix A, and clustering the points into two types $C_1$ and $C_2$ according to the plus-minus sign of the vector parameter value $p_i$, which is represented by a formula 6; dividing the global graph G into two local graphs $G_1$ and $G_2$ according to the clustering condition, wherein the two local graphs are composed of corresponding points n and edges e and are represented by a formula 7:

$$\begin{cases} C_1 = (p_i \mid V_2(p_i) > 0), & \text{if } \frac{\text{count}(C_1)}{\text{count(block)}} > 40\%; \\ C_2 = (p_i \mid V_2(p_i) \le 0), & \text{if } \frac{\text{count}(C_2)}{\text{count(block)}} > 40\%, \end{cases} \quad \text{(Formula 6)}$$

$$\begin{cases} G_1 = (n(C_1), \varepsilon(C_1)), \\ G_2 = (n(C_2), \varepsilon(C_2)), \end{cases} \quad \text{(Formula 7)}$$

in the formula 6, count($C_1$) is used for calculating the number of points in $C_1$, count($C_2$) for calculating the number of points in $C_2$, and count(block) for calculating the total number of points in the current coded block;

(3-5) respectively performing characteristic decomposition on the two local graphs $G_1$ and $G_2$ to obtain transformation matrices $A_1$ and $A_2$, which are used as local graph transformation matrices in the transformation mode II and used for transformation of color information corresponding to a point in the graph;

(3-6) the graph transformation with two transformation modes forms an enhanced graph transformation scheme;

The transformation mode decision described in the step 4) above comprises the following specific processes: firstly, the absolute values of the transformed coefficients Trans in the step 3) are arranged in a descending order, and then the sum of the absolute values of the largest coefficients in the previous k-dimension is calculated for the proportion in the sum of the absolute values of the transformed coefficients according to a formula 8, wherein an experience set value is generally used for k; the ratio value J is used as the score of the transformation mode, and the mode with a highest J is selected as the optimal transformation mode:

$$J = \frac{\sum_{i=1}^{k} |Trans_{(i)}|}{\sum_{i=1}^{all} |Trans_{(i)}|}$$ (Formula 8)

The specific process for the generation of a code stream with point cloud attribute compression in the step 5) comprises the steps of:

(5-1) after the processing of the steps 1) to 4), quantizing the transformed coefficient, performing entropy coding by combining transformation mode information, and generating a final code stream with point cloud attributes;

(5-2) the performance of point cloud attribute compression is measured by a code rate and a Peak Signal to Noise Ratio (PSNR), wherein the ode rate can be obtained by dividing the total number of bits of a code word by the number of points of the point cloud, in units of bits per point (bpp), and PSNR is in decibel dB; the smaller the ode rate is, the larger the PSNR is, and the better the performance of point cloud attribute compression is.

The above method includes, firstly, performing airspace division on the point cloud by the KD tree, then performing frequency domain division to the spectral clustering of the graph, compressing the attributes of the point cloud by the enhanced graph transformation scheme, providing two transformation modes, selecting the optimal mode by mode decision to achieve better point cloud compression performance.

Compared with the prior art, the invention has the beneficial effects.

The invention provides an enhanced graph transformation-based point cloud attribute compression method, which has the following technical advantages:

(1) airspace division is performed on the point cloud by using a KD tree; on this basis, frequency domain division is performed on the coded block by combining spectral analysis of the graph, so that more accurate point cloud division is realized, and a guarantee is provided for realizing better point cloud compression performance; and (2) on the basis of the original graph transformation, spectral clustering is expanded, and a transformation mode of local graph transformation is added to form an enhanced graph transformation with two transformation modes; and an optimal transformation mode is selected by mode decision, so that the graph transformation efficiency is increased, and the transformation performance is improved.

BRIEF DESCRIPTION OF THE DRAWINGS

FIG. 2 is an example flow diagram of an enhanced graph transformation process for a point cloud coded block.

wherein, (a) a point cloud example; (b) coded blocks obtained by KD tree division; (c) a coded block example; (d) performing enhanced graph transformation on the current coded block: if the clustering condition is met, the entire points graph is segmented into two local graphs; otherwise, no segmentation is performed.

FIG. 3 is an example diagram of a code stream structure after point cloud attribute information compression.

Figure 4B:
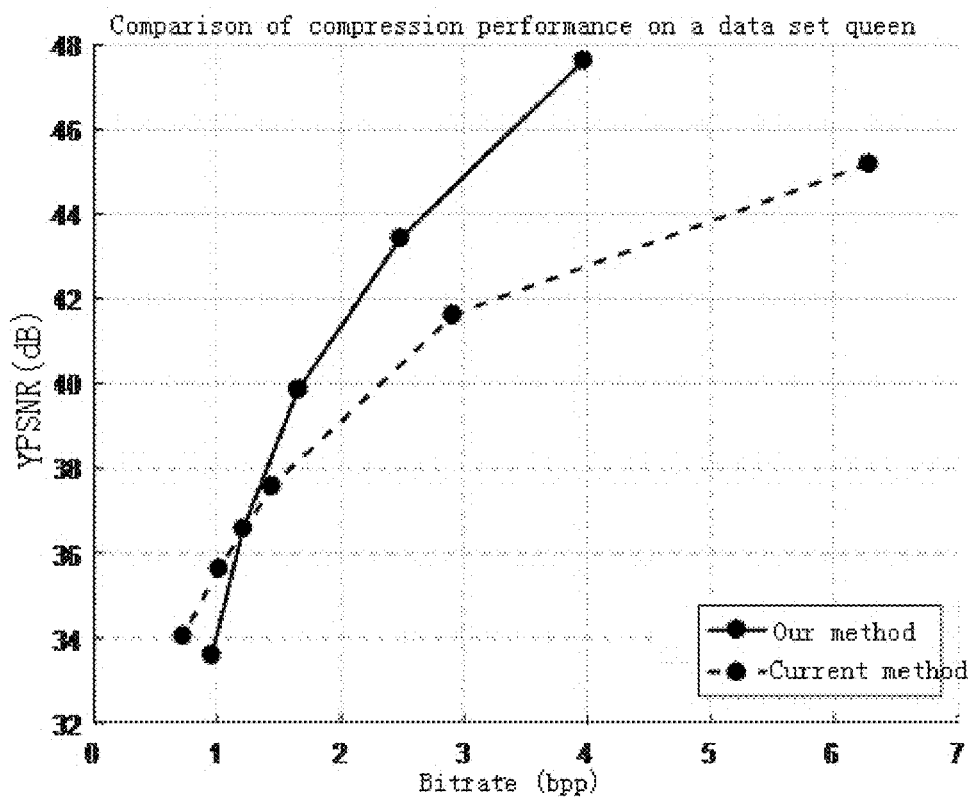
Figure 4C:
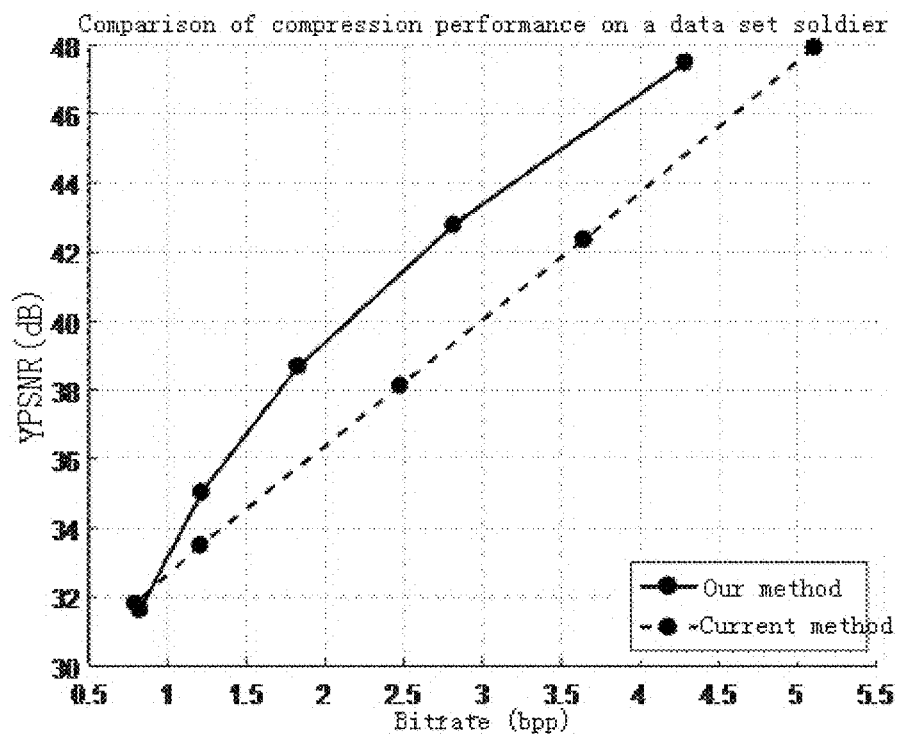

FIGS. 4a, 4b and 4c are comparison diagrams comparing the compression performance of the method of the present invention with that of a conventional method.

Wherein:

FIG. 4a is a comparison diagram for testing the compression performance of longdress_vox10_1300.ply;

FIG. 4b is a comparison diagram for testing the compression performance of Queen_frame_0200.ply;

FIG. 4c is a comparison diagram for testing the compression performance of soldier_vox10_0690.ply.

DETAILED DESCRIPTION

The invention will now be further described, by way of example, with reference to the accompanying drawings, which do not limit the scope of the invention in any way.

Figure 1:
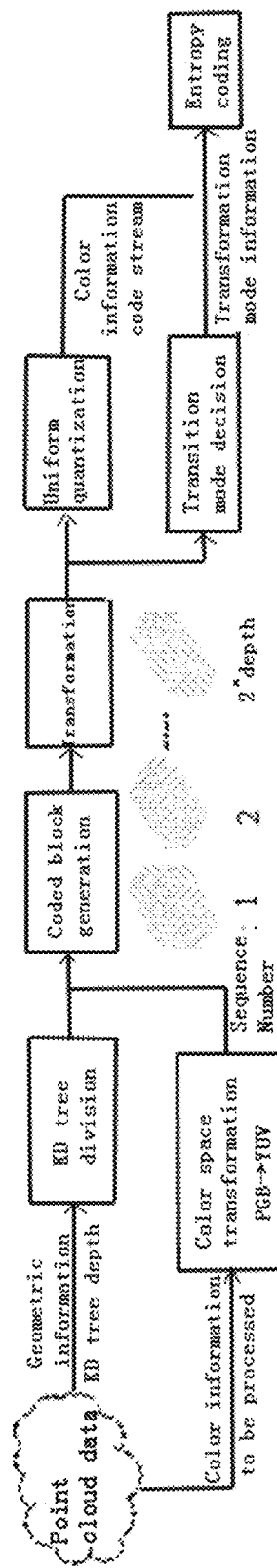
FIG. 1 is a flow block diagram of a method provided by the present invention.

A point cloud attribute compression method based on enhanced graph transformation of the present invention is provided, comprising, for point cloud data, first subjecting a point cloud to airspace division by using a K-dimension (KD) tree; providing a new graph transformation processing method in combination with spectral analysis; then subjecting the point cloud to spectral clustering on graphs in coded blocks of the point cloud; performing expansion on the basis of existing graph transformation to implement a local graph transformation scheme so as to form enhanced graph transformation with two transformation modes to improve the compression performance of graph transformation; and FIG. 1 is a flow block diagram of the method of the present invention.

For official point cloud data sets longdress_vox10_1300.ply, Queen_frame_0200.ply and soldier_vox10_0690.ply in an MPEG point cloud compression working group, performing point cloud attribute compression by the method provided by the invention as shown in FIG. 1 includes the specific implementation steps as follows:

(1) Color space transformation of point cloud attributes: reading in cloud attribute information to-be-processed point, wherein a point $p_i$ in the point cloud has color values $r_j$, $g_i$, and $b_i$ in an RGB color space, the RGB is transformed into a YUV color space by a color space transformation matrix, and the color value thereof are $y_i$, $u_i$, and $v_i$, as shown in a formula 1:

$$[y_i, u_i, v_i] = [r_i, g_i, b_i] \times \begin{bmatrix} 0.2126 & 0.7152 & 0.0722 \\ -0.1146 & -0.3854 & 0.5 \\ 0.5 & -0.4542 & -0.0458 \end{bmatrix}.$$ (Formula 1)

The RGB color values of the first point $p_1$ of the point cloud longdress_vox10_1300.ply are (102, 94, 87), and the YUV color values are (54.4128, −2.7926, 50.3798) obtained by the color transformation matrix processing.

The RGB color values of the first point $p_1$ of the point cloud Queen_frame_0200.ply are (102, 80, 71), and the YUV color values are (48.0172, 9.8702, 44.1126) obtained by the color transformation matrix processing.

The RGB color values of the first point $p_1$ of the point cloud soldier_vox10_0690.ply are (68, 65, 64), and the YUV color values are (39.0078, −5.4862, 34.4784) obtained by the color transformation matrix processing.

(2) Dividing the point cloud by using a KD tree to obtain coded blocks: the KD tree is essentially a binary tree; when the point cloud is divided by the KD tree, selecting a coordinate axis with a largest distribution variance in the position coordinate of the point cloud as a division axis each time, selecting a point with the coordinate being a median value on the axis as a division point, and performing iterative division until reaching a set KD tree depth, the KD trees after division and coded blocks with numbers.

The point cloud longdress_vox10_1300.ply has 857966 points, the KD tree division depth d is set to 13, and the number of points in the divided block is 104 or 105.

The point cloud Queen_frame_0200.ply has 1000993 points, the KD tree division depth d is set to 13, and the number of points in the divided block is 122 or 123.

The point cloud soldier_vox10_0690.ply has 1089091 points, the KD tree division depth d is set to 13, and the number of points in the divided block is 132 or 133.

(3) Spectral clustering-based enhanced graph transformation: the point cloud is divided by the KD tree in the step (2) to obtain coded blocks, and then the coded blocks are processed by using enhanced graph transformation with two transformation modes, wherein the processing flow is shown in FIG. 2. The essence of the enhanced graph transformation is to expand the spectral clustering of the graph into another transformation mode on the basis of the current graph transformation, and the specific details are as follows:

(3-1) constructing a graph: connecting every two points in a block by an edge to form a graph G consisting of points n and edges ε.

(3-2) adjacent matrices of the graph: the adjacent matrices W of the graph G is a set of edge weights $\omega_{ij}$ between two points $n_i$ and $n_j$ and reflects the correlation between the points in the transformation block, and the weight of the edge is determined by formula 2:

$$\omega_{i,j} = \begin{cases} e^{-\frac{\|n_i - n_j\|_2^2}{\sigma^2}}, & \text{if } \|n_i - n_j\| \leq \tau; \\ 0, & \text{else}, \end{cases} \quad \text{(Formula 2)}$$

here, the parameter σ is the variance of the geometric coordinates of the point cloud, and the parameter τ is the distance threshold for determining the correlation between two points, affecting the generation of the transformation matrix, τ being generally represented by $$\tau' = e^{-\frac{\tau}{\sigma^2}},$$

τ' set to 0.8.

(3-3) density matrix of the graph: the density matrix D of the graph G is a diagonal matrix, with the expression as shown in a formula 3, wherein $D_i$ is the sum of nonzero elements in the $i^{th}$ row of the adjacent matrices and reflects the correlation density of the $i^{th}$ point and other points;

$$D_i = \Sigma_j \omega_{i,j} \quad \text{(Formula 3)}$$

(3-4) Laplacian matrix of the graph: the transformation operator of graph G generally uses a Laplacian matrix L, with expression of a formula 4:

$$L = D - W \quad \text{(Formula 4)}$$

(3-5) the graph transformation matrix in transformation mode I: performing characteristic decomposition on the Laplacian matrix L to obtain a feature vector matrix A, which serves as a graph transformation matrix of the transformation mode I for compressing attribute information of the point cloud, wherein the characteristic decomposition is as follows:

$$L = A \Lambda A^{-1} \quad \text{(Formula 5)}$$

(3-6) the graph transformation matrix-based spectral clustering: performing spectral clustering on the second dimension column vector $V_2$ of the feature vector matrix A, and clustering the points into two types $C_1$ and $C_2$ according to the plus-minus sign of the vector parameter values $p_i$, which is represented by a formula 6; dividing the global graph G into two local graphs $G_1$ and $G_2$ according to the clustering condition, wherein the two local graphs are composed of corresponding points n and edges e and are represented by a formula 7:

$$\begin{cases} C_1 = (p_i \mid V_2(p_i) > 0), & \text{if } \frac{\text{count}(C_1)}{\text{count(block)}} > 40\%; \\ C_2 = (p_i \mid V_2(p_i) \leq 0), & \text{if } \frac{\text{count}(C_2)}{\text{count(block)}} > 40\% \end{cases} \quad \text{(Formula 6)}$$

$$\begin{cases} G_1 = (n(C_1), \varepsilon(C_1)), \\ G_2 = (n(C_2), \varepsilon(C_2)) \end{cases} \quad \text{(Formula 7)}$$

in the formula 6, count($C_1$) is used for calculating the number of points in $C_1$, count($C_2$) for calculating the number of points in $C_2$, and count(block) for calculating the total number of points in the current coded block;

(3-7) the graph transformation matrix in transformation mode II: respectively performing characteristic decomposition on the two local graphs $G_1$ and $G_2$ to obtain transformation matrices $A_1$ and $A_2$, which are used as local graph transformation matrices in the transformation mode II and used for transformation of color information corresponding to a point in the graph;

(3-8) the graph transformation with the two transformation modes forms an enhanced graph transformation scheme;

(4) transformation mode decision:
providing two modes for transforming the color information of the coded block, and performing a mode decision by estimating the transformation performance to select an optimal transformation mode; calculating the proportion of the sum of absolute values of the previous k maximum coefficients in the transformed coefficients in the sum of the absolute values of the transformed coefficients as the score of the transformation mode, as shown in a formula 8; the higher the score is, the higher the proportion is, representing higher transformation efficiency and better performance in the mode, wherein the mode with the highest score is selected as the transformation mode of the current block;

$$J = \frac{\sum_{i=1}^{k} |Trans_{(i)}|}{\sum_{i=1}^{all} |Trans_{(i)}|} \quad \text{(Formula 8)}$$

for example, the first coded block $b_1$ of the point cloud longdress_vox10_1300.ply uses scores J in transformation modes I and II of 0.58 and 0.4, respectively, so a mode with a larger J is selected as the optimal transformation mode for the block $b_1$;

(5) generation of a code stream with point cloud attribute compression: for 8192 coded blocks of the point cloud longdress_vox10_1300.ply, 8192 coded blocks of the Queen_frame_0200.ply and 8192 coded blocks of the soldier_vox10_0690.ply, color information in the block is subjected to enhanced graph transformation, quantization and entropy coding in sequence, combined with the code stream information in the transformation mode, and then written into a code stream file according to the sequence of the coded blocks, with the structure of the final code stream file as shown in FIG. 3. The performance of point cloud attribute compression is measured by the bitrate in units of bits per point (bpp) and Peak Signal to Noise Ratio (PSNR) in units of decibel dB.

In order to verify the effect of the enhanced graph transformation-based point cloud attribute compression method of the present invention, experiments are carried out using the above three data sets longdress_vox10_1300.ply, Queen_frame_0200.ply, soldier_vox10_0690.ply, and the compression performance is compared with the existing method as shown in FIGS. 4a, 4b and 4c.

As can be seen from FIGS. 4a, 4b and 4c, the method of the present invention is significantly superior in attribute compression performance over the existing mainstream method in the three typical point cloud sequences tested (Octree and DCT based attribute compression, R. N. Mekuria, K. Blom, and P. Cesar, "Design, Implementation and Evaluation of a Point Cloud Codec for Tele-Immersive Video", IEEE Trans. CSVT, vol. PP, no. 99, pp. 1-1, 2016.), PSNR improves by 1-4 dB at the same bitrate. Although the calculation amount of the method is slightly larger than that of the current method, the compression performance has obvious advantages, the sub-graph problem in previous graph transformation is overcome, and the advantages are prominent.

It should be noted that the examples are disclosed to aid in a further understanding of the present invention, but those skilled in the art will appreciate that various alternatives and modifications are possible without departing from the spirit and scope of the invention and the appended claims. Therefore, the invention should not be limited to the embodiments disclosed, but that the scope of the invention be defined by the claims.

INDUSTRIAL APPLICABILITY

The invention provides a point cloud attribute compression method based on enhanced graph transformation, which comprises the steps of, firstly, subjecting a point cloud to airspace division by using a K-dimension (KD) tree; then, subjecting graphs in coded blocks to spectral clustering by using spectral analysis-based graph transformation processing; performing expansion on the basis of existing graph transformation to implement a local graph transformation scheme; and forming enhanced graph transformation with two transformation modes to improve the compression performance of graph transformation. With the rapid development of three-dimensional scanning devices (laser, radar, etc.), the precision and resolution of point cloud are higher, which makes it possible to digitalize three-dimensional information in real world with high efficiency and precision. The invention can be widely applied to intelligent cities, driverlessness, cultural relics protection and other hot fields.

What is claimed is:

1. An enhanced graph transformation-based point cloud attribute compression method, comprising, for point cloud attribute information, first subjecting a point cloud to airspace division by using a K-dimension (KD) tree; providing a new graph transformation processing method in combination with spectral analysis; then subjecting the point cloud to spectral clustering on graphs in coded blocks of the point cloud; performing expansion on the basis of existing graph transformation to implement a local graph transformation scheme so as to form enhanced graph transformation with two transformation modes to improve the compression performance of graph transformation; the method comprises the steps of:

1) color space transformation of point cloud attributes reading in point cloud attribute information to be processed, and transforming a point cloud color space from an RGB space to a YUV space according to the visual characteristics of human eyes and the difficulty degree of compression processing;

2) dividing the point cloud by using a KD tree to obtain coded blocks, and numbering the coded blocks according to a breadth traversal sequence reading in geometric information of the point cloud, performing KD tree division on the point cloud according to the geometric information, selecting a coordinate axis with a largest distribution variance in the position coordinate of the point cloud as a division axis each time, selecting a point with the coordinate being a median value as a division point, and performing iterative division until reaching a set KD tree depth; a block obtained from a last layer divided by the KD tree being a coded block of the point cloud, numbering the coded blocks according to a breadth traversal sequence, and the number being used as a sequence for later processing of the coded blocks;

3) constructing a graph within the coded block by using enhanced graph transformation, with two transformation modes in the coded block, connecting every two points $n_i$ and $n_j$ by an edge $\varepsilon_{ij}$ to construct an entire points graph G, wherein each point on the graph has color information, and the weight of the edge is determined by the geometric relative position of the two points; the weight $\omega_{ij}$ of the edge $\varepsilon_{ij}$ reflects geometric correlation between the two points $n_i$ and $n_j$, and the weights $\omega$ of all the edges form an adjacent matrix W of the graph to further obtain a feature vector matrix A;

transformation mode I: taking the feature vector A of the entire points graph as a transformation matrix, and transforming the color information of the coded block;

transformation mode II: the feature vector matrix A of a graph G reflects the spectrum distribution of the graph, so that spectral clustering is performed on the basis of the matrix A to realize local graph segmentation; clustering all points in the block into two types by using a plus-minus sign of the second dimension column vector of the matrix A; if the number of the two types of points reaches more than 40% of the total number of the points in the block, dividing the graph G into two local graphs $G_1$, $G_2$ according to the clustering condition, so as to respectively obtain corresponding feature vector matrix $A_1$ and $A_2$; transforming the color information in the two local graphs $G_1$ and $G_2$ by using a corresponding transformation matrix;

4) transformation mode decision:

providing two modes for transforming the color information of the coded block, and performing a mode decision by estimating the transformation performance to select an optimal transformation mode; calculating the proportion of the sum of absolute values of the previous k maximum coefficients in the transformed coefficients in the sum of the absolute values of the transformed coefficients as the score of the transformation mode; the higher the score is, the higher the proportion of the selected transformation coefficient in the total transformation coefficient is, representing higher transformation efficiency and better performance in the mode, wherein the mode with the highest score is selected as the transformation mode of the current block;

5) generation of a code stream with point cloud attribute compression: processing all the coded blocks according to the coding sequence, quantizing the transformed coefficients, and performing entropy coding by combining the transformation mode information to obtain a final code stream with point cloud attribute compression.

2. The point cloud attribute compression method of claim 1, wherein the specific process of the color space transformation in the step 1) is as follows: a point $p_i$ in the point cloud has color values $r_i$, $g_i$ and $b_i$ in an RGB color space; the RGB is transformed into a YUV color space by a formula 1, and the color values thereof are $y_i$, $u_i$ and $v_i$.

$$[y_i, u_i, v_i] = [r_i, g_i, b_i] \times \begin{Bmatrix} 0.2126 & 0.7152 & 0.0722 \\ -0.1146 & -0.3854 & 0.5 \\ 0.5 & -0.4542 & -0.0458 \end{Bmatrix} \quad \text{(Formula 1)}$$

3. The point cloud attribute compression method of claim 1, wherein the KD tree division method in the step 2) is a binary division method; let the point cloud to be processed have N points, and the division depth set by the KD tree be d, $2^d$ coded blocks are obtained after the point cloud is divided for d times; and all coded blocks are numbered with $b_1, b_2, \ldots, b_i, \ldots, b_{2^d}$ in the breadth traversal sequence.

4. The point cloud attribute compression method of claim 1, wherein the specific process of the enhanced graph transformation in the step 3) comprises:

(4-1) constructing a graph G in each transformation block, wherein each two points $n_i$ and $n_j$ are connected by an edge $\varepsilon_{ij}$, and the weight $\omega_{ij}$ of the edge $\varepsilon_{ij}$ is related to the Euclidean distance between the two points and generally calculated by a formula 2:

$$\omega_{i,j} = \begin{cases} e^{-\frac{\|n_i - n_j\|_2^2}{\sigma^2}}, & \text{if } \|n_i - n_j\|_2^2 \leq \tau; \\ 0, & \text{else}, \end{cases} \quad \text{(Formula 2)}$$

wherein the parameter $\sigma$ reflects the distribution variance of the current point cloud; the parameter $\tau$ is a distance threshold for judging whether a connection line is formed between the two points, which determines the sparsity of a graph Laplacian matrix, and an experience set value is generally used;

(4-2) the adjacent matrix W of the graph G is a set of edge weights $\omega_{ij}$ and reflects the correlation between each point in the block; the density matrix D of the graph G is a diagonal matrix, wherein $D_i$ is the sum of non-zero elements in the i row of the adjacent matrix and represented by a formula 3, reflecting the density of correlation between the $i^{th}$ point and other points; the transformation operator of graph G adopts a Laplacian matrix L, and is represented by a formula 4:

$$D_i = \Sigma_j \omega_{i,j} \quad \text{(Formula 3)}$$

$$L = D - W \quad \text{(Formula 4)}$$

(4-3) performing characteristic decomposition on the Laplacian matrix L, which is represented by a formula 5 to obtain a feature vector matrix A, which serves as a global graph transformation matrix in the transformation mode 1 for compressing the point cloud attribute information:

$$L = A\Lambda A^{-1} \quad \text{(Formula 5)}$$

wherein A is a feature vector matrix;

(4-4) performing spectral clustering on the second dimension column vector $V_2$ of the feature vector matrix A, and clustering the points into two types $C_1$ and $C_2$ according to the plus-minus sign of the vector parameter value, which is represented by a formula 6; dividing the global graph G into two local graphs $G_1$ and $G_2$ according to the clustering condition, wherein the two local graphs are composed of corresponding points n and edges e and are represented by a formula 7:

$$\begin{cases} C_1 = (p_i \mid V_2(p_i) > 0), & \text{if } \frac{\text{count}(C_1)}{\text{count(block)}} > 40\%; \\ C_2 = (p_i \mid V_2(p_i) \leq 0), & \text{if } \frac{\text{count}(C_2)}{\text{count(block)}} > 40\%, \end{cases} \quad \text{(Formula 6)}$$

$$\begin{cases} G_1 = (n(C_1), \varepsilon(C_1)), \\ G_2 = (n(C_2), \varepsilon(C_2)), \end{cases} \quad \text{(Formula 7)}$$

in the formula 6, count($C_1$) is used for calculating the number of points in $C_1$, count($C_2$) for calculating the number of points in $C_2$, and count(block) for calculating the total number of points in the current coded block;

(4-5) respectively performing characteristic decomposition on the two local graphs $G_1$ and $G_2$ to obtain transformation matrices $A_1$ and $A_2$, which are used as local graph transformation matrices in the transformation mode II and used for transformation of color information corresponding to a point in the graph;

(4-6) the graph transformation with two transformation modes forms an enhanced graph transformation scheme.

5. The point cloud attribute compression method of claim 1, wherein in the transformation mode decision in the step 4), the key is to calculate the score J of the transformation mode; firstly, the absolute values of the transformed coefficients Trans are arranged in a descending order, and then the sum of the absolute values of the largest coefficients in the previous k-dimension selected is calculated for the proportion in the sum of the absolute values of the transformed coefficients, which is represented by a formula 8:

$$J = \frac{\sum_{i=1}^{k} |Trans_{(i)}|}{\sum_{i=1}^{all} |Trans_{(i)}|}. \qquad \text{(Formula 8)}$$

6. The point cloud attribute compression method of claim 1, wherein the specific details in the step 5) are as follows:
   (6-1) the code stream of point cloud attribute information is mainly composed of compressed header information and coded block information; wherein the header information mainly comprises quantization step length and the like; the coded block information stream is arranged in the order of coded blocks in units of coded blocks, and each block mainly comprises transformation mode information and color residual information of the coded blocks;
   (6-2) the performance of point cloud attribute compression is measured by a bitrate and a Peak Signal to Noise Ratio (PSNR), wherein the ode rate is in units of bits per point (bpp), and PSNR is in decibel dB; the smaller the ode rate is, the larger the PSNR is, and the better the performance of point cloud attribute compression is.

* * * * *